US009117459B2

(12) United States Patent
Kjoerling

(10) Patent No.: US 9,117,459 B2
(45) Date of Patent: Aug. 25, 2015

(54) PROCESSING OF AUDIO SIGNALS DURING HIGH FREQUENCY RECONSTRUCTION

(75) Inventor: Kristofer Kjoerling, Solna (SE)

(73) Assignee: Dolby International AB, Amsterdam (NL)

( * ) Notice: Subject to any disclaimer, the term of this patent is extended or adjusted under 35 U.S.C. 154(b) by 430 days.

(21) Appl. No.: 13/582,967

(22) PCT Filed: Jul. 14, 2011

(86) PCT No.: PCT/EP2011/062068
§ 371 (c)(1),
(2), (4) Date: Sep. 5, 2012

(87) PCT Pub. No.: WO2012/010494
PCT Pub. Date: Jan. 26, 2012

(65) Prior Publication Data

US 2012/0328124 A1 Dec. 27, 2012

Related U.S. Application Data

(60) Provisional application No. 61/386,725, filed on Sep. 27, 2010, provisional application No. 61/365,518, filed on Jul. 19, 2010.

(51) Int. Cl.
*H03G 5/00* (2006.01)
*G10L 21/038* (2013.01)

(52) U.S. Cl.
CPC .................................... *G10L 21/038* (2013.01)

(58) Field of Classification Search
CPC ........... H03G 5/00; H04R 3/04; G10L 19/008
USPC ............. 381/98, 66, 61, 22–23; 704/226, 233
See application file for complete search history.

(56) References Cited

U.S. PATENT DOCUMENTS 6,385,573 B1 5/2002 Gao
7,260,520 B2 8/2007 Henn
(Continued)

FOREIGN PATENT DOCUMENTS

CN 101458930 6/2009
EP 0208712 4/1993
(Continued)

OTHER PUBLICATIONS

ISO/IEC 14496-3 Information Technology—Coding of Audio-Visual Objects—Part 3: Audio, 2009.
(Continued)

*Primary Examiner* — Disler Paul

(57) ABSTRACT

The application relates to HFR (High Frequency Reconstruction/Regeneration) of audio signals. In particular, the application relates to a method and system for performing HFR of audio signals having large variations in energy level across the low frequency range which is used to reconstruct the high frequencies of the audio signal. A system configured to generate a plurality of high frequency subband signals covering a high frequency interval from a plurality of low frequency subband signals is described. The system comprises means for receiving the plurality of low frequency subband signals; means for receiving a set of target energies, each target energy covering a different target interval within the high frequency interval and being indicative of the desired energy of one or more high frequency subband signals lying within the target interval; means for generating the plurality of high frequency subband signals from the plurality of low frequency subband signals and from a plurality of spectral gain coefficients associated with the plurality of low frequency subband signals, respectively; and means for adjusting the energy of the plurality of high frequency subband signals using the set of target energies.

22 Claims, 8 Drawing Sheets

(56) References Cited

U.S. PATENT DOCUMENTS

| | | | | |
|---|---|---|---|---|
| 7,899,191 | B2 * | 3/2011 | Lakaniemi et al. | 381/23 |
| 8,295,507 | B2 * | 10/2012 | Mitsufuji et al. | 381/98 |
| 8,320,575 | B2 * | 11/2012 | Schmidt et al. | 381/66 |
| 2008/0212797 | A1 * | 9/2008 | Smirnov et al. | 381/98 |
| 2011/0019838 | A1 * | 1/2011 | Kaulberg et al. | 381/98 |
| 2012/0281859 | A1 * | 11/2012 | Villemoes et al. | 381/98 |
| 2013/0010976 | A1 * | 1/2013 | Schmidt et al. | 381/66 |

FOREIGN PATENT DOCUMENTS

| | | |
|---|---|---|
| EP | 1 342 230 | 5/2002 |
| EP | 2077550 | 7/2009 |
| JP | 2004-514180 | 5/2004 |
| JP | 2005-520219 | 7/2005 |
| JP | 2010-079275 | 4/2010 |
| JP | 2010-538315 | 12/2010 |
| RU | 2141166 | 11/1999 |
| RU | 2353980 | 4/2009 |
| WO | 98/57436 | 12/1998 |
| WO | 02/41301 | 5/2002 |
| WO | 2004/027368 | 4/2004 |
| WO | 2010/003557 | 1/2010 |
| WO | 2010003557 | 1/2010 |
| WO | 2010/016271 | 2/2010 |

OTHER PUBLICATIONS

MPEG-D USAC: ISO/IEC 23003-3—Unified Speech and Audio Coding, 2012.

Kjorling, K. et al. "CE Proposal on Improved SBR" MPEG Meeting ISO/IEC JTC1/SC29/WG11, Jul. 2010, p. 1-p. 3.

Kjorling, K. et al. "Finalization of CE on Improved SBR", MPEG meeting, Motion Picture Expert Group or ISO/IEC JTC1/SC29/WG11, Oct. 28, 2010, p. 1-p. 4, page 19.

* cited by examiner

PROCESSING OF AUDIO SIGNALS DURING HIGH FREQUENCY RECONSTRUCTION

TECHNICAL FIELD

The application relates to HFR (High Frequency Reconstruction/Regeneration) of audio signals. In particular, the application relates to a method and system for performing HFR of audio signals having large variations in energy level across the low frequency range which is used to reconstruct the high frequencies of the audio signal.

BACKGROUND OF THE INVENTION

HFR technologies, such as the Spectral Band Replication (SBR) technology, allow to significantly improve the coding efficiency of traditional perceptual audio codecs. In combination with MPEG-4 Advanced Audio Coding (AAC) HFR forms a very efficient audio codec, which is already in use within the XM Satellite Radio system and Digital Radio Mondiale, and also standardized within 3GPP, DVD Forum and others. The combination of AAC and SBR is called aacPlus. It is part of the MPEG-4 standard where it is referred to as the High Efficiency AAC Profile (HE-AAC). In general, HFR technology can be combined with any perceptual audio codec in a back and forward compatible way, thus offering the possibility to upgrade already established broadcasting systems like the MPEG Layer-2 used in the Eureka DAB system. HFR methods can also be combined with speech codecs to allow wide band speech at ultra low bit rates.

The basic idea behind HFR is the observation that usually a strong correlation between the characteristics of the high frequency range of a signal and the characteristics of the low frequency range of the same signal is present. Thus, a good approximation for the representation of the original input high frequency range of a signal can be achieved by a signal transposition from the low frequency range to the high frequency range.

This concept of transposition was established in WO 98/57436 which is incorporated by reference, as a method to recreate a high frequency band from a lower frequency band of an audio signal. A substantial saving in bit-rate can be obtained by using this concept in audio coding and/or speech coding. In the following, reference will be made to audio coding, but it should be noted that the described methods and systems are equally applicable to speech coding and in unified speech and audio coding (USAC).

High Frequency Reconstruction can be performed in the time-domain or in the frequency domain, using a filterbank or transform of choice. The process usually involves several steps, where the two main operations are to firstly create a high frequency excitation signal, and to subsequently shape the high frequency excitation signal to approximate the spectral envelope of the original high frequency spectrum. The step of creating a high frequency excitation signal may e.g. be based on single sideband modulation (SSB) where a sinusoid with frequency $\omega$ is mapped to a sinusoid with frequency $\omega+\Delta\omega$ where $\Delta\omega$ is a fixed frequency shift. In other words, the high frequency signal may be generated from the low frequency signal by a "copy-up" operation of low frequency subbands to high frequency subbands. A further approach to creating a high frequency excitation signal may involve harmonic transposition of low frequency subbands. Harmonic transposition of order T is typically designed to map a sinusoid of frequency $\omega$ of the low frequency signal to a sinusoid with frequency $T\omega$, with $T>1$, of the high frequency signal.

The HFR technology may be used as part of source coding systems, where assorted control information to guide the HFR process is transmitted from an encoder to a decoder along with a representation of the narrow band/low frequency signal. For systems where no additional control signal can be transmitted, the process may be applied on the decoder side with the suitable control data estimated from the available information on the decoder side.

The aforementioned envelope adjustment of the high frequency excitation signal aims at accomplishing a spectral shape that resembles the spectral shape of the original highband. In order to do so, the spectral shape of the high frequency signal has to be modified. Put differently, the adjustment to be applied to the highband is a function of the existing spectral envelope and the desired target spectral envelope.

For systems that operate in the frequency domain, e.g. HFR systems implemented in a pseudo-QMF filterbank, prior art methods are suboptimal in this regard, since the creation of the highband signal, by means of combining several contributions from the source frequency range, introduces an artificial spectral envelope into the highband to be envelope adjusted. In other words, the highband or high frequency signal generated from the low frequency signal during the HFR process typically exhibits an artificial spectral envelope (typically comprising spectral discontinuities). This poses difficulties for the spectral envelope adjuster, since the adjuster not only has to have the ability to apply the desired spectral envelope with proper time and frequency resolution, but the adjustor also has to be able to undo the artificially introduced spectral characteristics by the HFR signal generator. This poses difficult design constraints on the envelope adjuster. As a result, these difficulties tend to lead to a perceived loss of high frequency energy, and audible discontinuities in the spectral shape in the highband signal, particularly for speech type signals. In other words, conventional HFR signal generators tend to introduce discontinuities and level variations into the highband signal for signals which have large variations in level over the lowband range, e.g. sibilants. When subsequently the envelope adjuster is exposed to this highband signal, the envelope adjuster cannot with reasonability and consistence separate the newly introduced discontinuity from any natural spectral characteristic of the low band signal.

The present document outlines a solution to the aforementioned problem, which results in an increased perceived audio quality. In particular, the present document describes a solution to the problem of generating a highband signal from a lowband signal, wherein the spectral envelope of the highband signal is effectively adjusted to resemble the original spectral envelope in the highband without introducing undesirable artifacts.

SUMMARY OF THE INVENTION

The present document proposes an additional correction step as part of the high frequency reconstruction signal generation. As a result of the additional correction step, the audio quality of the high frequency component or highband signal is improved. The additional correction step may be applied to all source coding systems that use high frequency reconstruction techniques, as well as to any single ended post processing method or system that aims at re-creating high frequencies of an audio signal.

According to an aspect, a system configured to generate a plurality of high frequency subband signals covering a high frequency interval is described. The system may be configured to generate the plurality of high frequency subband signals from a plurality of low frequency subband signals. The plurality of low frequency subband signals may be subband signals of a lowband or narrowband audio signal, which may be determined using an analysis filterbank or transform. In particular, the plurality of low frequency subband signals may be determined from a lowband time-domain signal using an analysis QMF (quadrature mirror filter) filterbank or an FFT (Fast Fourier Transform). The plurality of generated high frequency subband signals may correspond to an approximation of the high frequency subband signals of an original audio signal from which the plurality of low frequency subband signals has been derived. In particular, the plurality of low frequency subband signals and the plurality of (re-)generated high frequency subband signals may correspond to the subbands of a QMF filterbank and/or an FFT transform.

The system may comprise means for receiving the plurality of low frequency subband signals. As such, the system may be placed downstream of the analysis filterbank or transform which generates the plurality of low frequency subband signals from a lowband signal. The lowband signal may be an audio signal which has been decoded in a core decoder from a received bitstream. The bitstream may be stored on a storage medium, e.g. a compact disc or a DVD, or the bitstream may be received at the decoder over a transmission medium, e.g. an optical or radio transmission medium.

The system may comprise means for receiving a set of target energies, which may also be referred to as scalefactor energies. Each target energy may cover a different target interval, which may also be referred to as a scalefactor band, within the high frequency interval. Typically, the set of target intervals which corresponds to the set of target energies covers the complete high frequency interval. A target energy of the set of target energies is usually indicative of the desired energy of one or more high frequency subband signals lying within the corresponding target interval. In particular, the target energy may correspond to the average desired energy of the one or more high frequency subband signals which lie within the corresponding target interval. The target energy of a target interval is typically derived from the energy of the highband signal of the original audio signal within the target interval. In other words, the set of target energies typically describes the spectral envelope of the highband portion of the original audio signal.

The system may comprise means for generating the plurality of high frequency subband signals from the plurality of low frequency subband signals. For this purpose, the means for generating the plurality of high frequency subband signals may be configured to perform a copy-up transposition of the plurality of low frequency subband signals and/or to perform a harmonic transposition of the plurality of low frequency subband signals.

Furthermore, the means for generating the plurality of high frequency subband signals may take into account a plurality of spectral gain coefficients during the generation process of the plurality of high frequency subband signals. The plurality of spectral gain coefficients may be associated with the plurality of low frequency subband signals, respectively. In other words, each low frequency subband signal of the plurality of low frequency subband signals may have a corresponding spectral gain coefficient from the plurality of spectral gain coefficients. A spectral gain coefficient from the plurality of spectral gain coefficients may be applied to the corresponding low frequency subband signal.

The plurality of spectral gain coefficients may be associated with the energy of the respective plurality of low frequency subband signals. In particular, each spectral gain coefficient may be associated with the energy of its corresponding low frequency subband signal. In an embodiment, a spectral gain coefficient is determined based on the energy of the corresponding low frequency subband signal. For this purpose, a frequency dependent curve may be determined based on the plurality of energy values of the plurality of low frequency subband signals. In this case, a method for determining the plurality of gain coefficients may rely on the frequency dependent curve which is determined from a (e.g. logarithmic) representation of the energies of the plurality of low frequency subband signals.

In other words, the plurality of spectral gain coefficients may be derived from a frequency dependent curve fitted to the energy of the plurality of low frequency subband signals. In particular, the frequency dependent curve may be a polynomial of a pre-determined order/degree. Alternatively or in addition, the frequency dependent curve may comprise different curve segments, wherein the different curve segments are fitted to the energy of the plurality of low frequency subband signals at different frequency intervals. The different curve segments may be different polynomials of a pre-determined order. In an embodiment, the different curve segments are polynomials of order zero, such that the curve segments represent the mean energy values of the energy of the plurality of low frequency subband signals within the corresponding frequency interval. In a further embodiment, the frequency dependent curve is fitted to the energy of the plurality of low frequency subband signals by performing a moving average filtering operation along the different frequency intervals.

In an embodiment, a gain coefficient of the plurality of gain coefficients is derived from the difference of the mean energy of the plurality of low frequency subband signals and of a corresponding value of the frequency dependent curve. The corresponding value of the frequency dependent curve may be a value of the curve at a frequency lying within the frequency range of the low frequency subband signal to which the gain coefficient corresponds.

Typically, the energy of the plurality of low frequency subband signals is determined on a certain time-grid, e.g. on a frame by frame basis, i.e. the energy of a low frequency subband signal within a time interval defined by the time-grid corresponds to the average energy of the samples of the low frequency subband signal within the time interval, e.g. within a frame. As such, a different plurality of spectral gain coefficients may be determined on the chosen time-grid, e.g. a different plurality of spectral gain coefficients may be determined for each frame of the audio signal. In an embodiment, the plurality of spectral gain coefficients may be determined on a sample by sample basis, e.g. by determining the energy of the plurality of low frequency subbands using a floating window across the samples of each low frequency subband signal. It should be noted that the system may comprise means for determining the plurality of spectral gain coefficients from the plurality of low frequency subband signals. These means may be configured to perform the above mentioned methods for determining the plurality of spectral gain coefficients.

The means for generating the plurality of high frequency subband signals may be configured to amplify the plurality of low frequency subband signals using the respective plurality of spectral gain coefficients. Even though reference is made to "amplifying" or "amplification" in the following, the "amplification" operation may be replaced by other operations, such as a "multiplication" operation, a "rescaling" operation or an "adjustment" operation. The amplification may be done by multiplying a sample of a low frequency subband signal with its corresponding spectral gain coefficient. In particular, the means for generating the plurality of high frequency subband signals may be configured to determine a sample of a high frequency subband signal at a given time instant from samples of a low frequency subband signal at the given time instant and at at least one preceding time instant. Furthermore, the samples of the low frequency subband signal may be amplified by the respective spectral gain coefficient of the plurality of spectral gain coefficients. In an embodiment, the means for generating the plurality of high frequency subband signals are configured to generate the plurality of high frequency subband signals from the plurality of low frequency subband signals in accordance to the “copy-up” algorithm specified in MPEG-4 SBR. The plurality of low frequency subband signals used in this “copy-up” algorithm may have been amplified using the plurality of spectral gain coefficients, wherein the “amplification” operation may have been performed as outlined above.

The system may comprise means for adjusting the energy of the plurality of high frequency subband signals using the set of target energies. This operation is typically referred to as spectral envelope adjustment. The spectral envelope adjustment may be performed by adjusting the energy of the plurality of high frequency subband signals such that the average energy of the plurality of high frequency subband signals lying within a target interval corresponds to the corresponding target energy. This may be achieved by determining an envelope adjustment value from the energy values of the plurality of high frequency subband signals lying within a target interval and the corresponding target energy. In particular, the envelope adjustment value may be determined from a ratio of the target energy and the energy values of the plurality of high frequency subband signals lying within a corresponding target interval. This envelope adjustment value may be used for adjusting the energy of the plurality of high frequency subband signals.

In an embodiment, the means for adjusting the energy comprise means for limiting the adjustment of the energy of the high frequency subband signals lying within a limiter interval. Typically, the limiter interval covers more than one target interval. The means for limiting are usually used for avoiding an undesirable amplification of noise within certain high frequency subband signals. For example, the means for limiting may be configured to determine a mean envelope adjustment value of the envelope adjustment values corresponding to the target intervals covered by or lying within the limiter interval. Furthermore, the means for limiting may be configured to limit the adjustment of the energy of the high frequency subband signals lying within the limiter interval to a value which is proportional to the mean envelope adjustment value.

Alternatively or in addition, the means for adjusting the energy of the plurality of high frequency subband signals may comprise means for ensuring that the adjusted high frequency subband signals lying within the particular target interval have the same energy. The latter means are often referred to as “interpolation” means. In other words, the “interpolation” means ensure that the energy of each of the high frequency subband signals lying within the particular target interval corresponds to the target energy. The “interpolation” means may be implemented by adjusting each high frequency subband signal within the particular target interval separately such that the energy of the adjusted high frequency subband signal corresponds to the target energy associated with the particular target interval. This may be achieved by determining a different envelope adjustment value for each high frequency subband signal within the particular target interval. A different envelope adjustment value may be determined based on the energy of the particular high frequency subband signal and the target energy corresponding to the particular target interval. In an embodiment, an envelope adjustment value for a particular high frequency subband signal is determined based on the ratio of the target energy and the energy of the particular high frequency subband signal.

The system may further comprise means for receiving control data. The control data may be indicative of whether to apply the plurality of spectral gain coefficients to generate the plurality of high frequency subband signals. In other words, the control data may be indicative of whether the additional gain adjustment of the low frequency subband signals is to be performed or not. Alternatively or in addition, the control data may be indicative of a method which is to be used for determining the plurality of spectral gain coefficients. By way of example, the control data may be indicative of the pre-determined order of the polynomial which is to be used to determine the frequency dependent curve fitted to the energies of the plurality of low frequency subband signals. The control data is typically received from a corresponding encoder which analyzes the original audio signal and informs the corresponding decoder or HFR system on how to decode the bitstream.

According to another aspect, an audio decoder configured to decode a bitstream comprising a low frequency audio signal and comprising a set of target energies describing the spectral envelope of a high frequency audio signal is described. In other words, an audio decoder configured to decode a bitstream representative of a low frequency audio signal and representative of a set of target energies describing the spectral envelope of a high frequency audio signal is described. The audio decoder may comprise a core decoder and/or transform unit configured to determine a plurality of low frequency subband signals associated with the low frequency audio signal from the bitstream. Alternatively or in addition, the audio decoder may comprise a high frequency generation unit according to the system outlined in the present document, wherein the system may be configured to determine a plurality of high frequency subband signals from the plurality of low frequency subband signals and the set of target energies. Alternatively or in addition, the decoder may comprise a merging and/or inverse transform unit configured to generate an audio signal from the plurality of low frequency subband signals and the plurality of high frequency subband signals. The merging and inverse transform unit may comprise a synthesis filterbank or transform, e.g. an inverse QMF filterbank or an inverse FFT.

According to a further aspect, an encoder configured to generate control data from an audio signal is described. The audio encoder may comprise means to analyse the spectral shape of the audio signal and to determine a degree of spectral envelope discontinuities introduced when re-generating a high frequency component of the audio signal from a low frequency component of the audio signal. As such, the encoder may comprise certain elements of a corresponding decoder. In particular, the encoder may comprise a HFR system as outlined in the present document. This would enable the encoder to determine the degree of discontinuities in the spectral envelope which could be introduced to the high frequency component of the audio signal on the decoder side. Alternatively or in addition, the encoder may comprise means to generate control data for controlling the re-generation of the high frequency component based on the degree of discontinuities. In particular, the control data may correspond to the control data received by the corresponding decoder or the HFR system. The control data may be indicative of whether to use the plurality of spectral gain coefficients during the HFR process and/or which pre-determined polynomial order to use in order to determine the plurality of spectral gain coefficients. In order to determine this information a ratio of the selected parts of the low frequency interval, i.e. the frequency range covered by the plurality of low frequency subband signals, could be determined. This ratio information can be determined by e.g. studying the lowest frequencies of the lowband, and the highest frequencies of the lowband to assess the spectral variation of the lowband signal that in the decoder subsequently will be used for high frequency reconstruction. A high ratio could indicate an increased degree of discontinuity. The control data could also be determined using signal type detectors. By way of example, the detection of speech signals could indicate an increased degree of discontinuity. On the other hand, the detection of prominent sinusoids in the original audio signal could lead to control data indicating that the plurality of spectral gain coefficients should not be used during the HFR process.

According to another aspect, a method for generating a plurality of high frequency subband signals covering a high frequency interval from a plurality of low frequency subband signals is described. The method may comprise the steps of receiving the plurality of low frequency subband signals and/or of receiving a set of target energies. Each target energy may cover a different target interval within the high frequency interval. Furthermore, each target energy may be indicative of the desired energy of one or more high frequency subband signals lying within the target interval. The method may comprise the step of generating the plurality of high frequency subband signals from the plurality of low frequency subband signals and from a plurality of spectral gain coefficients associated with the plurality of low frequency subband signals, respectively. Alternatively or in addition, the method may comprise the step of adjusting the energy of the plurality of high frequency subband signals using the set of target energies. The step of adjusting the energy may comprise the step of limiting the adjustment of the energy of the high frequency subband signals lying within a limiter interval. Typically, the limiter interval covers more than one target interval.

According to a further aspect, a method for decoding a bitstream representative of or comprising a low frequency audio signal and a set of target energies describing the spectral envelope of a corresponding high frequency audio signal is described. Typically, the low frequency and high frequency audio signals correspond to a low frequency and high frequency component of the same original audio signal. The method may comprise the step of determining a plurality of low frequency subband signals associated with the low frequency audio signal from the bitstream. Alternatively or in addition, the method may comprise the step of determining a plurality of high frequency subband signals from the plurality of low frequency subband signals and the set of target energies. This step is typically performed in accordance with the HFR methods outlined in the present document. Subsequently, the method may comprise the step of generating an audio signal from the plurality of low frequency subband signals and the plurality of high frequency subband signals.

According to another aspect, a method for generating control data from an audio signal is described. The method may comprise the step of analysing the spectral shape of the audio signal in order to determine a degree of discontinuities introduced when re-generating a high frequency component of the audio signal from a low frequency component of the audio signal. Furthermore, the method may comprise the step of generating control data for controlling the re-generation of the high frequency component based on the degree of discontinuities.

According to a further aspect, a software program is described. The software program may be adapted for execution on a processor and for performing the method steps outlined in the present document when carried out on a computing device.

According to another aspect, a storage medium is described. The storage medium may comprise a software program adapted for execution on a processor and for performing the method steps outlined in the present document when carried out on a computing device.

According to a further aspect, a computer program product is described. The computer program may comprise executable instructions for performing the method steps outlined in the present document when executed on a computer.

It should be noted that the methods and systems including their preferred embodiments as outlined in the present patent application may be used stand-alone or in combination with the other methods and systems disclosed in this document. Furthermore, all aspects of the methods and systems outlined in the present patent application may be arbitrarily combined. In particular, the features of the claims may be combined with one another in an arbitrary manner.

BRIEF DESCRIPTION OF THE DRAWINGS

The invention is explained below by way of illustrative examples with reference to the accompanying drawings, wherein.

DESCRIPTION OF PREFERRED EMBODIMENTS

The below-described embodiments are merely illustrative for the principles of the present invention PROCESSING OF AUDIO SIGNALS DURING HIGH FREQUENCY RECONSTRUCTION. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

As outlined above, audio decoders using HFR techniques typically comprise an HFR unit for generating a high frequency audio signal and a subsequent spectral envelope adjustment unit for adjusting the spectral envelope of the high frequency audio signal. When adjusting the spectral envelope of the audio signal, this is typically done by means of a filterbank implementation, or by means of time-domain filtering. The adjustment can either strive to do a correction of the absolute spectral envelope, or it can be performed by means of filtering which also corrects phase characteristics. Either way, the adjustment is typically a combination of two steps, the removal of the current spectral envelope, and the application of the target spectral envelope.

It is important to note, that the methods and systems outlined in the present document are not merely directed at the removal of the spectral envelope of the audio signal. The methods and systems strive to do a suitable spectral correction of the spectral envelope of the lowband signal as part of the high frequency regeneration step, in order to not introduce spectral envelope discontinuities of the high frequency spectrum created by combining different segments of the lowband, i.e. of the low frequency signal, shifted or transposed to different frequency ranges of the highband, i.e. of the high frequency signal.

Figure 1A:
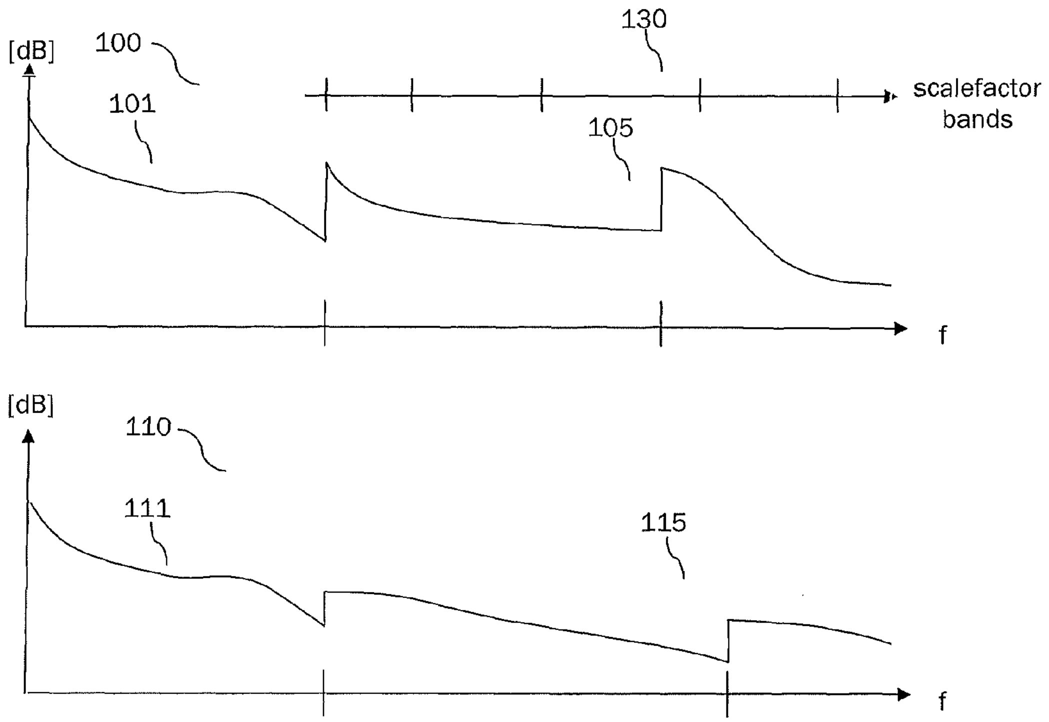
FIG. 1*a* illustrates the absolute spectrum of an example high band signal prior to spectral envelope adjustment.

In FIG. 1*a* a stylistically drawn spectrum 100, 110 of the output of an HFR unit is displayed, prior to going into the envelope adjuster. In the top-panel, a copy-up method (with two patches) is used to generate the highband signal 105 from the lowband signal 101, e.g. the copy-up method used in MPEG-4 SBR (Spectral Band Replication) which is outlined in "ISO/IEC 14496-3 Information Technology—Coding of audio-visual objects—Part 3: Audio" and which is incorporated by reference. The copy-up method translates parts of the lower frequencies 101 to higher frequencies 105. In the lower panel, a harmonic transposition method (with two patches) is used to generate the highband signal 115 from the lowband signal 111, e.g. the harmonic transposition method of MPEG-D USAC which is described in "MPEG-D USAC: ISO/IEC 23003-3—Unified Speech and Audio Coding" and which is incorporated by reference.

In the subsequent envelope adjustment stage, a target spectral envelope is applied onto the high frequency components 105, 115. As can be seen from the spectrum 105, 115 going into the envelope adjuster, discontinuities (notably at the patch borders) can be observed in the spectral shape of the highband excitation signal 105, 115, i.e. of the highband signal entering the envelope adjuster. These discontinuities originate from the fact that several contributions of the low frequencies 101, 111 are used in order to generate the highband 105, 115. As can be seen, the spectral shape of the highband signal 105, 115 is related to the spectral shape of the lowband signal 101, 111. Consequently, particular spectral shapes of the lowband signal 101, 111, e.g. a gradient shape illustrated in FIG. 1*a*, may lead to discontinuities in the overall spectrum 100, 110.

In addition to the spectrum 100, 110, FIG. 1*a* illustrates example frequency bands 130 of the spectral envelope data representing the target spectral envelope. These frequency bands 130 are referred to as scalefactor bands or target intervals. Typically, a target energy value, i.e. a scalefactor energy, is specified for each target interval, i.e. scalefactor band. In other words, the scalefactor bands define the effective frequency resolution of the target spectral envelope, as there is typically only a single target energy value per target interval. Using the scalefactors or target energies specified for the scalefactor bands, the subsequent envelope adjuster strives to adjust the highband signal so that the energy of the highband signal within the scalefactor bands equals the energy of the received spectral envelope data, i.e. the target energy, for the respective scalefactor bands.

Figure 1B:
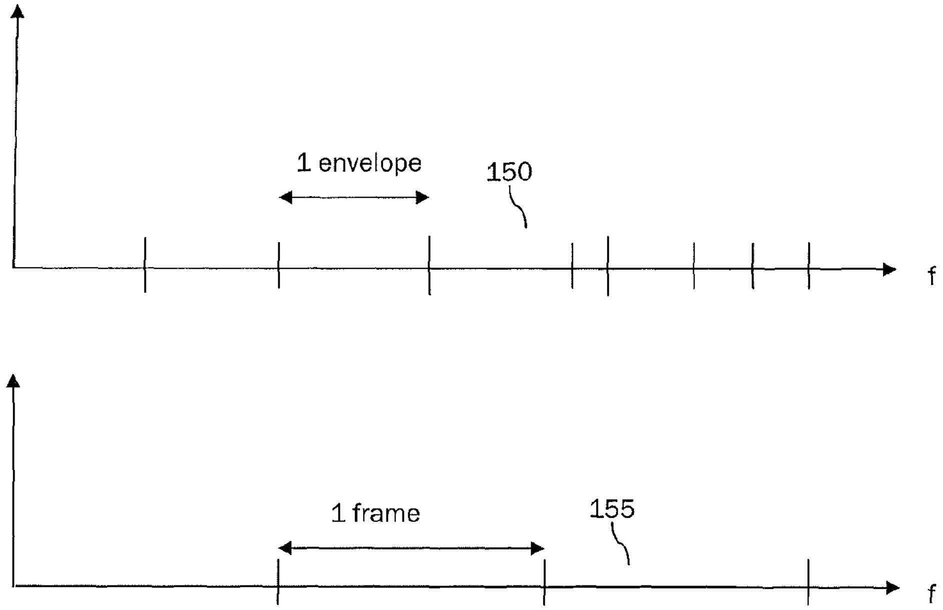
FIG. 1*b* illustrates an exemplary relation between time-frames of audio data and envelope time borders of the spectral envelopes.
Figure 1C:
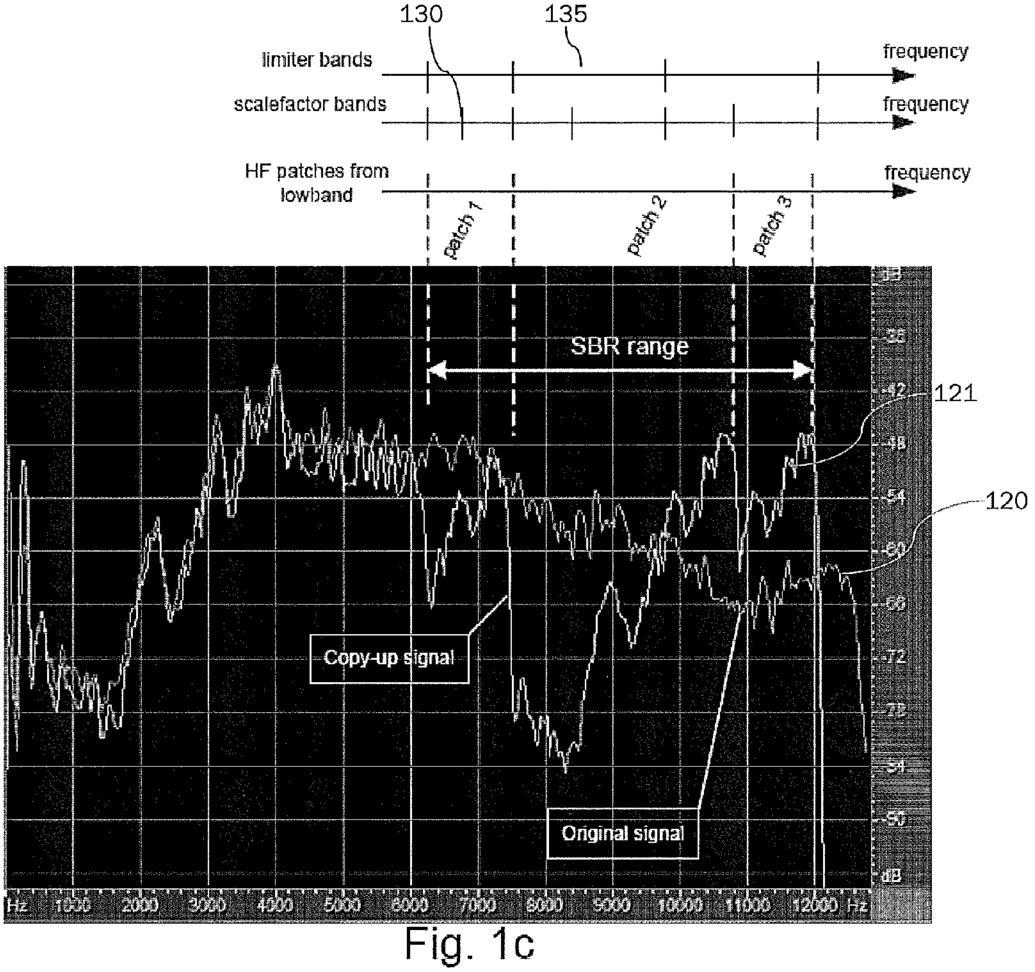
FIG. 1*c* illustrates the absolute spectrum of an example high band signal prior to spectral envelope adjustment, and the corresponding scalefactor bands, limiter bands, and HF (high frequency) patches.

In FIG. 1*c* a more detailed description is provided using an example audio signal. In the plot the spectrum of a real-world audio signal 121 going into the envelope adjuster is depicted, as well as the corresponding original signal 120. In this particular example, the SBR range, i.e. the range of the high frequency signal, starts at 6.4 kHz, and consists of three different replications of the lowband frequency range. The frequency ranges of the different replications are indicated by "patch 1", "patch 2", and "patch 3". It is clear from the spectrogram that the patching introduces discontinuities in the spectral envelope at around 6.4 kHz, 7.4 kHz, and 10.8 kHz. In the present example, these frequencies correspond to the patch borders.

FIG. 1*c* further illustrates the scalefactor bands 130 as well as the limiter bands 135, of which the function will be outlined in more detail in the following. In the illustrated embodiment, the envelope adjuster of the MPEG-4 SBR is used. This envelope adjuster operates using a QMF filterbank. The main aspects of the operation of such an envelope adjuster are:

- to calculate the mean energy across a scalefactor band 130 of the input signal to the envelope adjuster, i.e. the signal coming out of the HFR unit; in other words, the mean energy of the regenerated highband signal is calculated within each scalefactor band/target interval 130;
- to determine a gain value, also referred to as envelope adjustment value, for each scalefactor band 130, wherein the envelope adjustment value is the square root of the energy ratio between the target energy (i.e. the energy target received from an encoder), and the mean energy of the regenerated highband signal 121 within the respective scalefactor band 130;
- to apply the respective envelope adjustment value to the frequency band of the regenerated highband signal 121, wherein the frequency band corresponds to the respective scalefactor band 130.

Furthermore, the envelope adjuster may comprise additional steps and variations, in particular:

- a limiter functionality, which limits the maximum allowed envelope adjustment value to be applied over a certain frequency band, i.e. over a limiter band 135. The maximum allowed envelope adjustment value is a function of the envelope adjustment values determined for the different scalefactor bands 130 which fall within a limiter band 135. In particular, the maximum allowed envelope adjustment value is a function of the mean of the envelope adjustment values determined for the different scalefactor bands 130 which fall within a limiter band 135. By way of example, the maximum allowed envelope adjustment value may be the mean value of the relevant envelope adjustment values multiplied by a limiter factor (such as 1.5). The limiter functionality is typically applied in order to limit the introduction of noise into the regenerated highband signal 121. This is particularly relevant for audio signals comprising prominent sinusoids, i.e. audio signals having a spectrum with distinct peaks at certain frequencies. Without the use of the limiter functionality, significant envelope adjustment values would be determined for the scalefactor bands 130 for which the original audio signal comprises such distinct peaks. As a result, the spectrum of the complete scalefactor band 130 (and not only the distinct peak) would be adjusted, thereby introducing noise.

an interpolation functionality, which allows the envelope adjustment values to be calculated for each individual QMF subband within a scalefactor band, instead of calculating a single envelope adjustment value for the entire scalefactor band. Since the scalefactor bands typically comprise more than one QMF subband, a envelope adjustment value can be calculated as the ratio of the energy of a particular QMF subband within the scalefactor band and the target energy received from the encoder, instead of calculating the ratio of the mean energy of all QMF subbands within the scalefactor band and the target energy received from the encoder. As such, a different envelope adjustment value may be determined for each QMF subband within a scalefactor band. It should be noted that the received target energy value for a scalefactor band typically corresponds to the average energy of that frequency range within the original signal. It is up to the decoder operation how to apply the received average target energy to the corresponding frequency band of the regenerated highband signal. This can be done by applying an overall envelope adjustment value to the QMF subbands within a scalefactor band of the regenerated highband signal or by applying an individual envelope adjustment value to each QMF subband. The latter approach can be thought of as if the received envelope information (i.e. one target energy per scalefactor band) was "interpolated" across the QMF subbands within a scalefactor band in order to provide a higher frequency resolution. Hence, this approach is referred to as "interpolation" in MPEG-4 SBR.

Returning to FIG. 1*c* it can be seen that the envelope adjuster would have to apply high envelope adjustment values in order to match the spectrum 121 of the signal going into the envelope adjuster with the spectrum 120 of the original signal. It can also be seen that due to the discontinuities, large variations of envelope adjustment values occur within the limiter bands 135. As a result of such large variations, the envelope adjustment values which correspond to the local minima of the regenerated spectrum 121 will be limited by the limiter functionality of the envelope adjuster. As a result, the discontinuities within the re-generated spectrum 121 will remain, even after performing the envelope adjustment operation. On the other hand, if no limiter functionality is used, undesirable noise may be introduced as outlined above.

Hence, a problem for the re-generation of a highband signal occurs for any signal that has large variations in level over the lowband range. This problem is due to the discontinuities introduced during the high frequency re-generation of the highband. When subsequently the envelope adjuster is exposed to this re-generated signal, it cannot with reasonability and consistence separate the newly introduced discontinuity from any "real-world" spectral characteristic of the lowband signal. The effects of this problem are two-fold. First, spectral shapes are introduced in the highband signal that the envelope adjuster cannot compensate for. Consequently, the output has the wrong spectral shape. Second, an instability effect is perceived, due to the fact that this effect comes and goes as a function of the lowband spectral characteristics.

The present document addresses the above mentioned problem by describing a method and system which provide an HFR highband signal at the input of the envelope adjuster which does not exhibit spectral discontinuities. For this purpose, it is proposed to remove or reduce the spectral envelope of the lowband signal when performing high frequency regeneration. By doing this, one will avoid to introduce any spectral discontinuities into the highband signal prior to performing envelope adjustment. As a result, the envelope adjuster will not have to handle such spectral discontinuities. In particular, a conventional envelope adjuster may be used, wherein the limiter functionality of the envelope adjuster is used to avoid the introduction of noise into the regenerated highband signal. In other words, the described method and system may be used to re-generate an HFR highband signal having little or no spectral discontinuities and a low level of noise.

It should be noted that the time-resolution of the envelope adjuster may be different from the time resolution of the proposed processing of the spectral envelope during the highband signal generation. As indicated above, the processing of the spectral envelope during the highband signal re-generation is intended to modify the spectral envelope of the lowband signal, in order to alleviate the processing within the subsequent envelope adjuster. This processing, i.e. the modification of the spectral envelope of the lowband signal, may be performed e.g. once per audio frame, wherein the envelope adjuster may adjust the spectral envelope over several time intervals, i.e. using several received spectral envelopes. This is outlined in FIG. 1*b* where the time-grid 150 of the spectral envelope data is depicted in the top panel, and the time-grid 155 for the processing of the spectral envelope of the lowband signal during highband signal re-generation is depicted in the lower panel. As can be seen in the example of FIG. 1*b*, the time-borders of the spectral envelope data varies over time, while the processing of the spectral envelope of the lowband signal operates on a fixed time-grid. It can also be seen that several envelope adjustment cycles (represented by the time-borders 150) may be performed during one cycle of processing of the spectral envelope of the lowband signal. In the illustrated example, the processing of the spectral envelope of the lowband signal operates on a frame by frame basis, meaning that a different plurality of spectral gain coefficients is determined for each frame of the signal. It should be noted that the processing of the lowband signal may operate on any time-grid, and that the time-grid of such processing does not have to coincide with the time-grid of the spectral envelope data.

Figure 2:
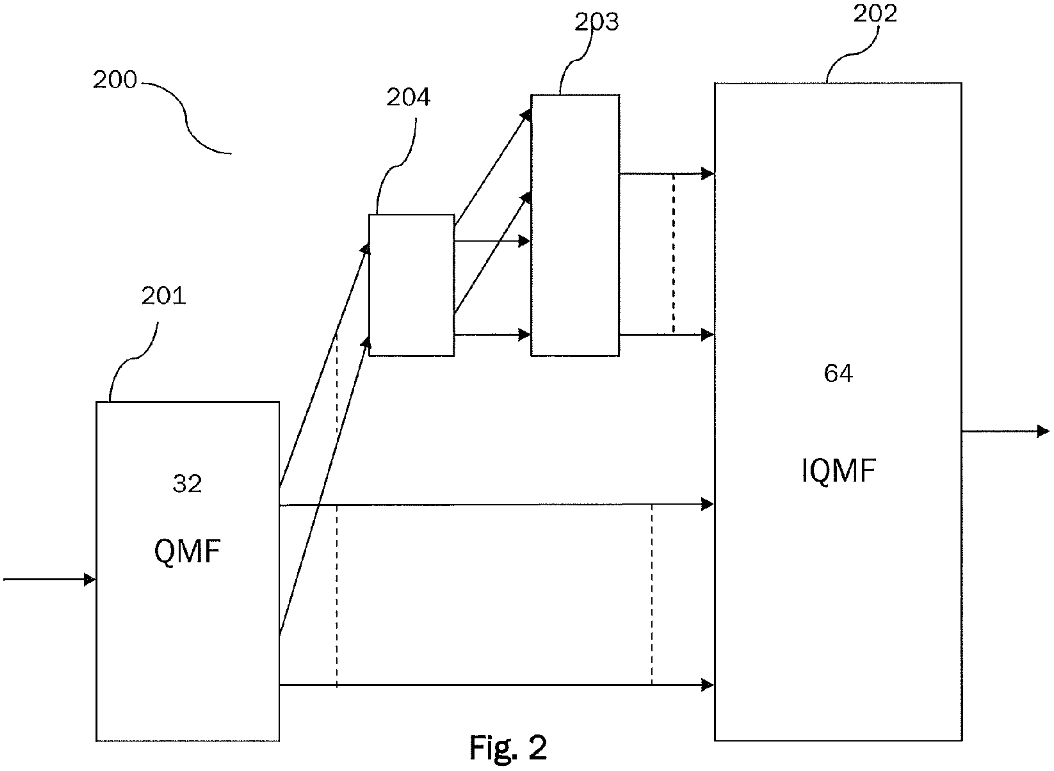
FIG. 2 illustrates an embodiment of a HFR system where the copy-up process is complemented with an additional gain adjustment step.

In FIG. 2, a filterbank based HFR system 200 is depicted. The HFR system 200 operates using a pseudo-QMF filterbank and the system 200 may be used to produce the highband and lowband signal 100 illustrated on the top panel of FIG. 1*a*. However, an additional step of gain adjustment has been added as part of the High Frequency Generation process, which in the illustrated example is a copy-up process. The low frequency input signal is analyzed by a 32 subband QMF 201 in order to generate a plurality of low frequency subband signals. Some or all of the low frequency subband signals are patched to higher frequency locations according to a HF (high frequency) generation algorithm. Additionally, the plurality of low frequency subbands is directly input to the synthesis filterbank 202. The aforementioned synthesis filterbank 202 is a 64 subband inverse QMF 202. For the particular implementation illustrated in FIG. 2, the use of a 32 subband QMF analysis filterbank 201 and the use of a 64 subband QMF synthesis filterbank 202 will yield an output sampling rate of the output signal of twice the input sampling rate of the input signal. It should be noted, however, that the systems outlined in the present document are not limited to systems with different input and output sampling rates. A multitude of different sampling rate relations can be envisioned by those skilled in the art.

As outlined in FIG. 2, the subbands from the lower frequencies are mapped to subbands of higher frequencies. A gain adjustment stage 204 is introduced as part of this copy-up process. The created high frequency signal, i.e. the generated plurality of high frequency subband signals, is input to the envelope adjuster 203 (possibly comprising a limiter and/or interpolation functionality), prior to combination with the plurality of low frequency subband signals in the synthesis filterbank 202. By using such an HFR system 200, and in particular by using a gain adjustment stage 204, the introduction of spectral envelope discontinuities as illustrated in FIG. 1 can be avoided. For this purpose, the gain adjustment stage 204 modifies the spectral envelope of the lowband signal, i.e. the spectral envelope of the plurality of low frequency subband signals, such that the modified lowband signal can be used to generate a highband signal, i.e. a plurality of high frequency subband signals, which does not exhibit discontinuities, notably discontinuities at the patch borders. Referring to FIG. 1*c*, the additional gain adjustment stage 204 ensures that the spectral envelope 101, 111 of the lowband signal is modified such that there are no, or limited, discontinuities in the generated highband signal 105, 115.

The modification of the spectral envelope of the lowband signal can be achieved by applying a gain curve to the spectral envelope of the lowband signal. Such a gain curve can be determined by a gain curve determination unit 400 illustrated in FIG. 4. The module 400 takes as input the QMF data 402 corresponding to the frequency range of the lowband signal used for re-creating the highband signal. In other words, the plurality of low frequency subband signals is input to the gain curve determination unit 400. As already indicated, only a subset of the available QMF subbands of the lowband signal may be used to generate the highband signal, i.e. only a subset of the available QMF subbands may be input to the gain curve determination unit 400. In addition, the module 400 may receive optional control data 404, e.g. control data sent from a corresponding encoder. The module 400 outputs a gain curve 403 which is to be applied during the high frequency regeneration process. In an embodiment, the gain curve 403 is applied to the QMF subbands of the lowband signal, which are used to generate the highband signal. I.e. the gain curve 403 may be used within the copy-up process of the HFR process.

The optional control data 404 may comprise information on the resolution of the coarse spectral envelope which is to be estimated in the module 400, and/or information on the suitability of applying the gain-adjustment process. As such, the control data 404 may control the amount of additional processing involved during the gain-adjustment process. The control data 404 may also trigger a by-pass of the additional gain adjustment processing, if signals occur that do not lend themselves well to coarse spectral envelope estimation, e.g. signals comprising single sinusoids.

Figure 3:
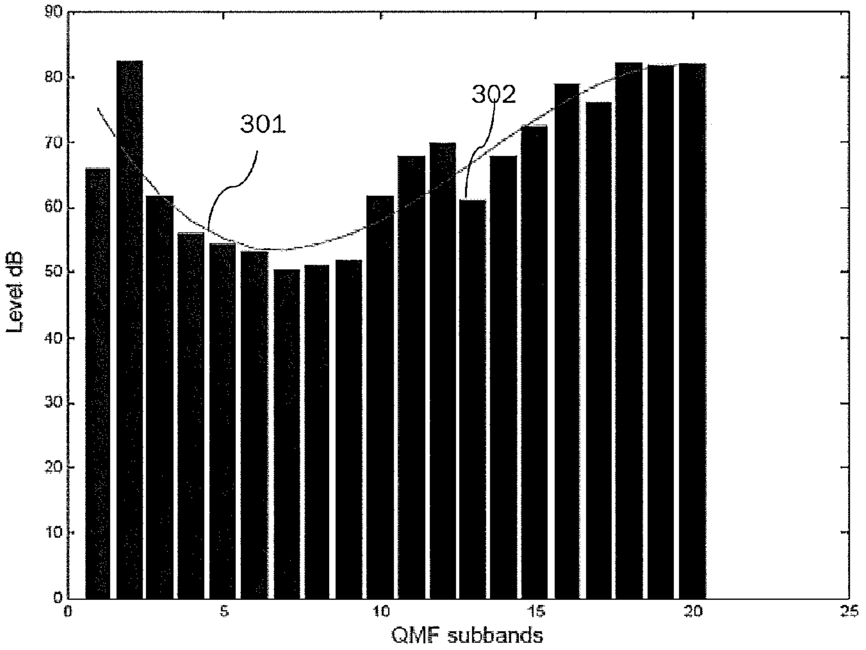
FIG. 3 illustrates an approximation of the coarse spectral envelope of an example lowband signal.
Figure 4:
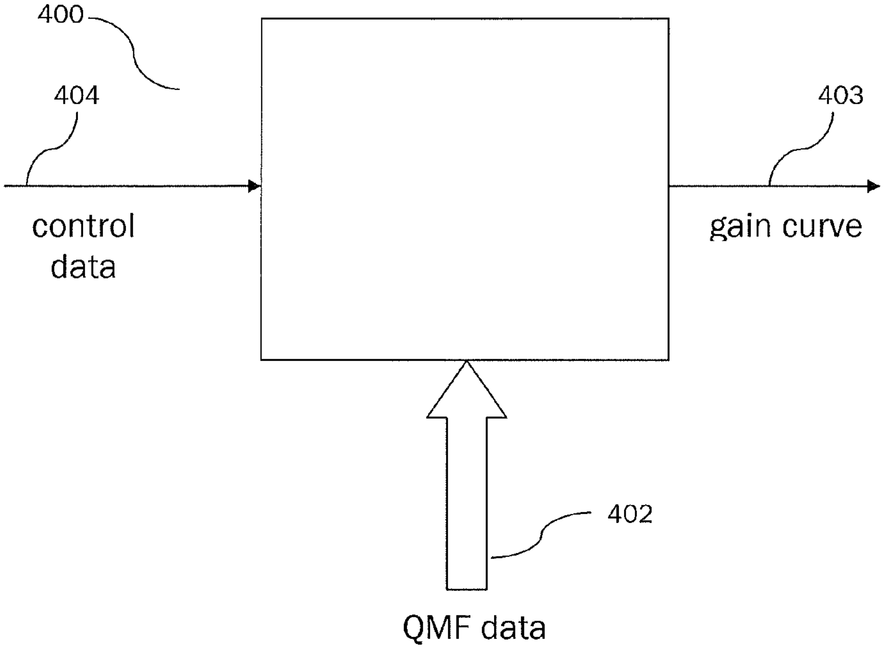
FIG. 4 illustrates an embodiment of an additional gain adjuster operating on optional control data, the QMF subbands samples, and outputting a gain curve.
Figure 5:
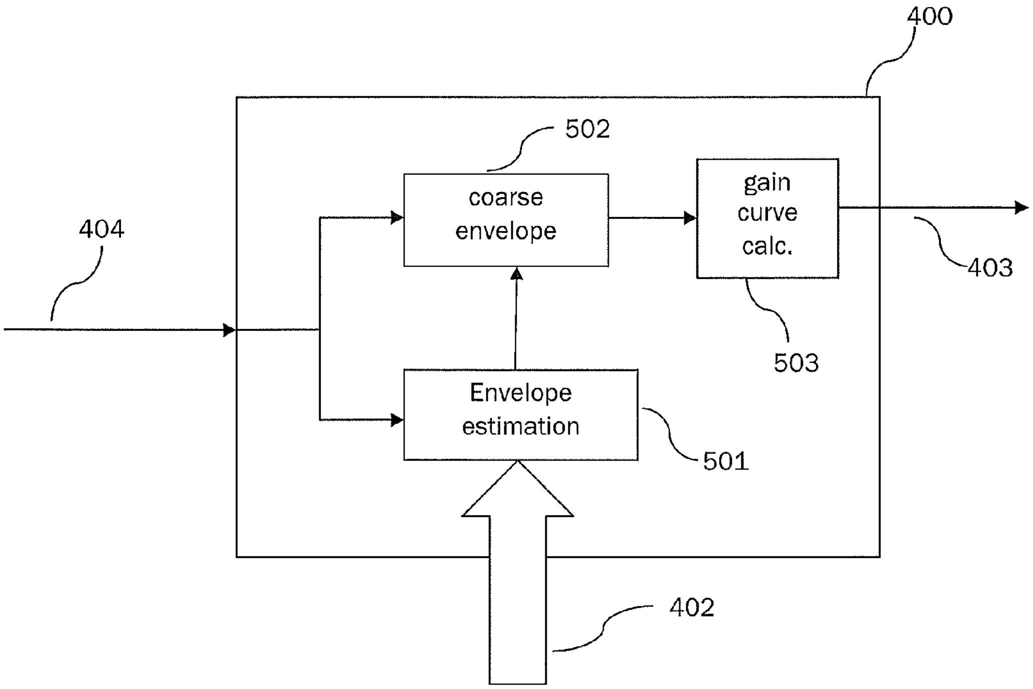
FIG. 5 illustrates a more detailed embodiment of the additional gain adjuster of FIG. 4.

In FIG. 5 a more detailed view of the module 400 in FIG. 4 is outlined. The QMF data 402 of the lowband signal is input to an envelope estimation unit 501 that estimates the spectral envelope, e.g. on a logarithmic energy scale. The spectral envelope is subsequently input to a module 502 that estimates the coarse spectral envelope from the high (frequency) resolution spectral envelope received from the envelope estimation unit 501. In one embodiment, this is done by fitting a low order polynomial to the spectral envelope data, i.e. a polynomial of an order in the range of e.g. 1, 2, 3, or 4. The coarse spectral envelope may also be determined by performing a moving average operation of the high resolution spectral envelope along the frequency axis. The determination of a coarse spectral envelope 301 of a lowband signal is visualized in FIG. 3. It can be seen that the absolute spectrum 302 of the lowband signal, i.e. the energy of the QMF bands 302, is approximated by a coarse spectral envelope 301, i.e. by a frequency dependent curve fitted to the spectral envelope of the plurality of low frequency subband signals. Furthermore, it is shown that only 20 QMF subband signals are used for generating the highband signal, i.e. only a part of the 32 QMF subband signals are used within the HFR process.

The method used for determining the coarse spectral envelope from the high resolution spectral envelope and in particular the order of the polynomial which is fitted to the high resolution spectral envelope can be controlled by the optional control data 404. The order of the polynomial may be a function of the size of the frequency range 302 of the lowband signal for which a coarse spectral envelope 301 is to be determined, and/or it may be a function of other parameters relevant for the overall coarse spectral shape of the relevant frequency range 302 of the lowband signal. The polynomial fitting calculates a polynomial that approximates the data in a least square error sense. In the following, a preferred embodiment is outlined, by means of Matlab code:

```
function GainVec = calculateGainVec(LowEnv)
%% function GainVec = calculateGainVec(LowEnv)
% Input: Lowband envelope energy in dB
% Output: gain vector to be applied to the lowband prior to HF-
%             generation
%
% The function does a low order polynomial fitting of the low band
% spectral envelope, as a representation of the lowband overall
% spectral slope. The overall slope according to this is subsequently
% translated into a gain vector that can be applied prior to HF-
% generation to remove the overall slope (or coarse spectral shape).
%
% This prevents that the HF generation introduces discontinuities in
% the spectral shape, that will be "confusing" for the subsequent
% envelope adjustment and limiter-process. The "confusion" occurs when
% the envelope adjuster and limiter needs to take care of a large dis-
% continuity, and thus a large gain value. It is very difficult to
```

-continued

```
% tune and have a proper operation of these modules if they are to
% take care of both "natural" variations in the highband as well as
% the "artificial" variations introduced by the HF generation process.
    polyOrderWhite = 3;
    x_lowBand = 1:length(LowEnv);
    p=polyfit(x_lowBand,LowEnv,polyOrderWhite);
    lowBandEnvSlope = zeros(size(x_lowBand));
    for k=polyOrderWhite:−1:0
        tmp = (x_lowBand.^k).*p(polyOrderWhite − k + 1);
        lowBandEnvSlope = lowBandEnvSlope + tmp;
    end
    GainVec = 10.^((mean(LowEnv) − lowBandEnvSlope)./20);
```

In the above code, the input is the spectral envelope (LowEnv) of the lowband signal obtained by averaging QMF subband samples on a per subband basis over a time-interval corresponding to the current time frame of data operated on by the subsequent envelope adjuster. As indicated above, the gain-adjustment processing of the lowband signal may be performed on various other time-grids. In the above example, the estimated absolute spectral envelope is expressed in a logarithmic domain. A polynomial of low order, in the above example a polynomial of order 3, is fitted to the data. Given the polynomial, a gain curve (GainVec) is calculated from the difference in mean energy of the lowband signal and the curve (lowBandEnvSlope)) obtained from the polynomial fitted to the data. In the above example, the operation of determining the gain curve is done in the logarithmic domain.

The gain curve calculation is performed by the gain curve calculation unit 503. As indicated above, the gain curve may be determined from the mean energy of the part of the lowband signal used to re-generate the highband signal, and from the spectral envelope of the part of the lowband signal used to re-generate the highband signal. In particular, the gain curve may be determined from the difference of the mean energy and the coarse spectral envelope, represented e.g. by a polynomial. I.e. the calculated polynomial may be used to determine a gain curve which comprises a separate gain value, also referred to as a spectral gain coefficient, for every relevant QMF subband of the lowband signal. This gain curve comprising the gain values is subsequently used in the HFR process.

As an example, an HFR generation process in accordance to MPEG-4 SBR is described next. The HF generated signal may be derived by the following formula (see document MPEG-4 Part 3 (ISO/IEC 14496-3), sub-part 4, section 4.6.18.6.2, which is incorporated by reference):

$$X_{High}(k,l+t_{HFAdj})=X_{Low}(p,l+t_{HFAdj})+bw\text{Array}(g(k))\cdot\alpha_0(p)\cdot X_{Low}(p,l-1+t_{HFAdj})+[bw\text{Array}(g(k))]^2\cdot\alpha_1(p)\cdot X_{Low}(p,l-2+t_{HFAdj}),$$

wherein p is the subband index of the lowband signal, i.e. p identifies one of the plurality of low frequency subband signals. The above HF generation formula may be replaced by the following formula which performs a combined gain adjustment and HF generation:

$$X_{High}(k,\ l+t_{HFAdj}) = preGain(p)\cdot(X_{Low}(p,\ l+t_{HFAdj})) + bwArray(g(k))\cdot\alpha_0(p)\cdot X_{Low}(p,\ l-1+t_{HFAdj}) + [bwArray(g(k))]^2\cdot\alpha_1(p)\cdot X_{Low}(p,\ l-2+t_{HFAdj})$$

wherein the gain curve is referred to as preGain(p).

Further details of the copy-up process, e.g. with regards to the relation between p and k, are specified in the above mentioned MPEG-4, Part 3 document. In the above formula, $X_{Low}$ (p,l) indicates a sample at time instance l of the low frequency subband signal having a subband index p. This sample in combination with preceding samples is used to generate a sample of the high frequency subband signal $X_{High}$(k,l) having a subband index k.

Figure 6:
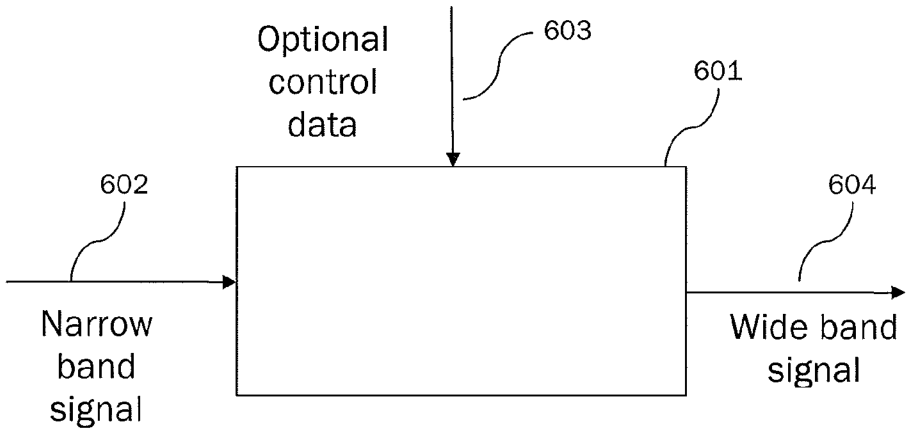
FIG. 6 illustrates an embodiment of an HFR system with a narrowband signal as input and a wideband signal as output.

It should be noted that the aspect of gain adjustment can be used in any filterbank based high frequency reconstruction system. This is illustrated in FIG. 6 where the present invention is part of a standalone HFR unit 601 that operates on a narrowband or lowband signal 602 and outputs a wideband or highband signal 604. The module 601 may receive additional control data 603 as input, wherein the control data 603 may specify, among other things, the amount of processing used for the described gain adjustment, as well as e.g. information on the target spectral envelope of the highband signal. However, these parameters are only examples of optional control data 603. In an embodiment, relevant information may also be derived from the narrow band signal 602 input to the module 601, or by other means. I.e. the control data 603 may be determined within the module 601 based on the information available at the module 601. It should be noted that the standalone HFR unit 601 may receive the plurality of low frequency subband signals and may output the plurality of high frequency subband signals, i.e. the analysis/synthesis filterbanks or transforms may be placed outside the HFR unit 601.

As already indicated above, it may be beneficial to signal the activation of the gain adjustment processing in the bitstream from an encoder to a decoder. For certain signal types, e.g. a single sinusoid, the gain adjustment processing may not be relevant and it may therefore be beneficial to enable the encoder/decoder system to turn the additional processing off in order to not introduce an unwanted behaviour for such corner case signals. For this purpose, the encoder may be configured to analyze the audio signals and to generate control data which turns on and off the gain adjustment processing at the decoder.

Figure 7:
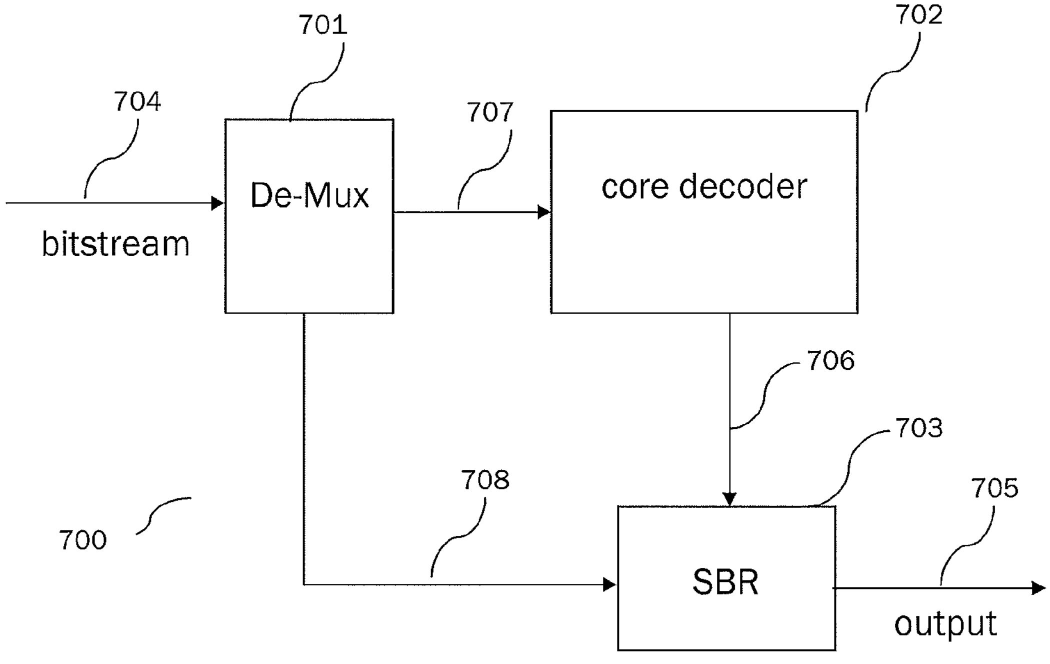
FIG. 7 illustrates an embodiment of an HFR system incorporated into the SBR module of an audio decoder.

In FIG. 7 the proposed gain adjustment stage is included in a high frequency reconstruction unit 703 which is part of an audio codec. One example of such a HFR unit 703 is the MPEG-4 Spectral Band Replication tool used as part of the High Efficiency AAC codec or the MPEG-D USAC (Unified Speech and Audio Codec). In this embodiment a bitstream 704 is received at an audio decoder 700. The bitstream 704 is de-multiplexed in de-multiplexer 701. The SBR relevant part of the bitstream 708 is fed to the SBR module or HFR unit 703, and the core coder relevant bitstream 707, e.g. AAC data or USAC core decoder data, is sent to the core coder module 702. In addition, the lowband or narrow band signal 706 is passed from the core decoder 702 to the HFR unit 703. The present invention is incorporated as part of the SBR-process in HFR unit 703, e.g. in accordance to the system outlined in FIG. 2. The HFR unit 703 outputs a wideband or highband signal 705 using the processing outlined in the present document.

Figure 8:
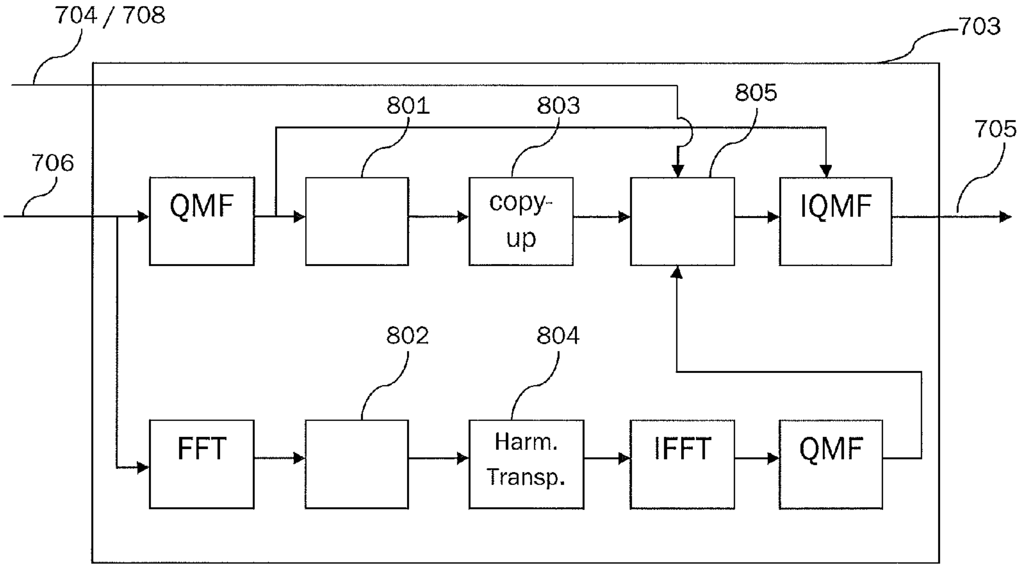
FIG. 8 illustrates an embodiment of the high frequency reconstruction module of an example audio decoder.

In FIG. 8, an embodiment of the high frequency reconstruction module 703 is outlined in more detail. FIG. 8 illustrates that the HF (high frequency) signal generation may be derived from different HF generation modules at different instances in time. The HF generation may be based either on a QMF based copy-up transposer 803, or the HF generation may be based on a FFT based harmonic transposer 804. For both HF signal generation modules, the lowband signal is processed 801, 802 as part of the HF generation in order to determine a gain curve which is used in the copy-up 803 or harmonic transposition 804 process. The outputs from the two transposers are selectively input to the envelope adjuster 805. The decision on which transposer signal to use is controlled by the bitstream 704 or 708. It should be noted that, due to the copy-up nature of the QMF based transposer, the shape of the spectral envelope of the lowband signal is maintained more clearly than when using a harmonic transposer. This will typically result in more distinct discontinuities of the spectral envelope of the highband signal when using copy-up transposers. This is illustrated in the top and bottom panels of FIG. 1*a*. Consequently, it may be sufficient to only incorporate the gain adjustment for the QMF-based copy-up method performed in module 803. Nevertheless, applying the gain adjustment for the harmonic transposition performed in module 804 may be beneficial as well.

Figure 9:
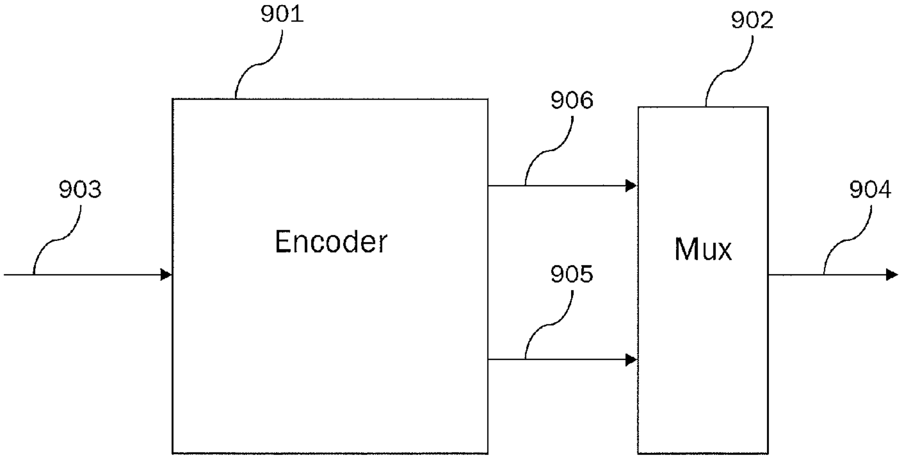
FIG. 9 illustrates an embodiment of an example encoder.

In FIG. 9, a corresponding encoder module is outlined. The encoder 901 may be configured to analyse the particular input signal 903 and determine the amount of gain adjustment processing which is suitable for the particular type of input signal 903. In particular, the encoder 901 may determine the degree of discontinuity on the high frequency subband signal which will be caused by the HFR unit 703 at the decoder. For this purpose, the encoder 901 may comprise an HFR unit 703, or at least relevant parts of the HFR unit 703. Based on the analysis of the input signal 903, control data 905 can be generated for the corresponding decoder. The information 905, which concerns the gain adjustment to be performed at the decoder, is combined in multiplexer 902 with audio bitstream 906, thereby forming the complete bitstream 904 which is transmitted to the corresponding decoder.

Figure 10A:
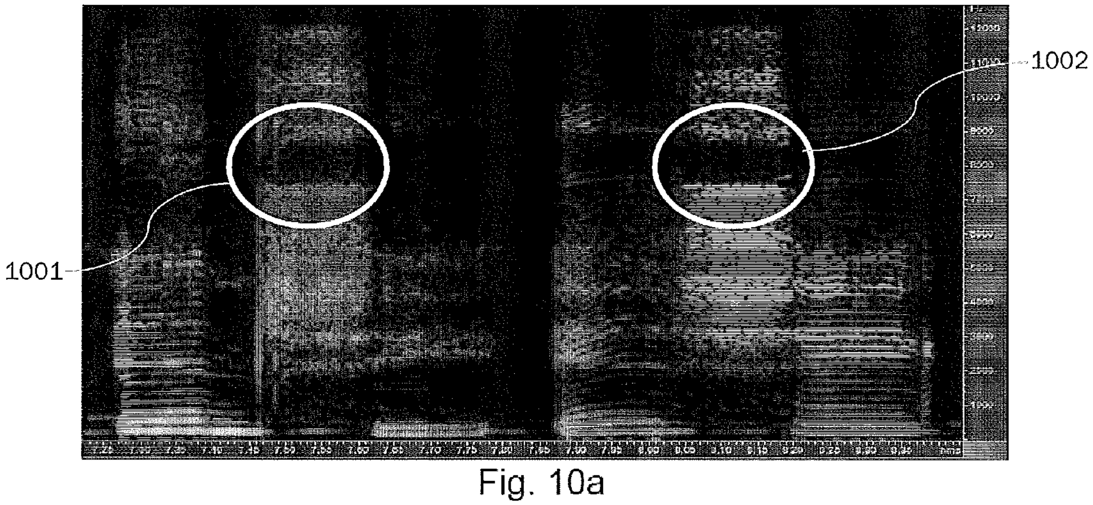
FIG. 10*a* illustrates the spectrogram of an example vocal segment which has been decoded using a conventional decoder.
Figure 10B:
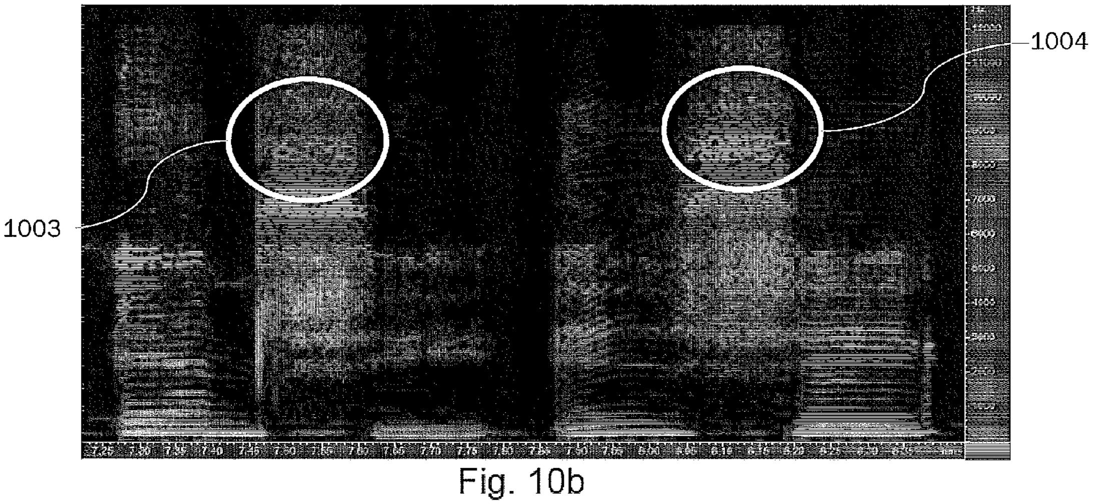
FIG. 10*b* illustrates the spectrogram of the vocal segment of FIG. 10*a*, which has been decoded using a decoder applying the additional gain adjustment processing.
Figure 10C:
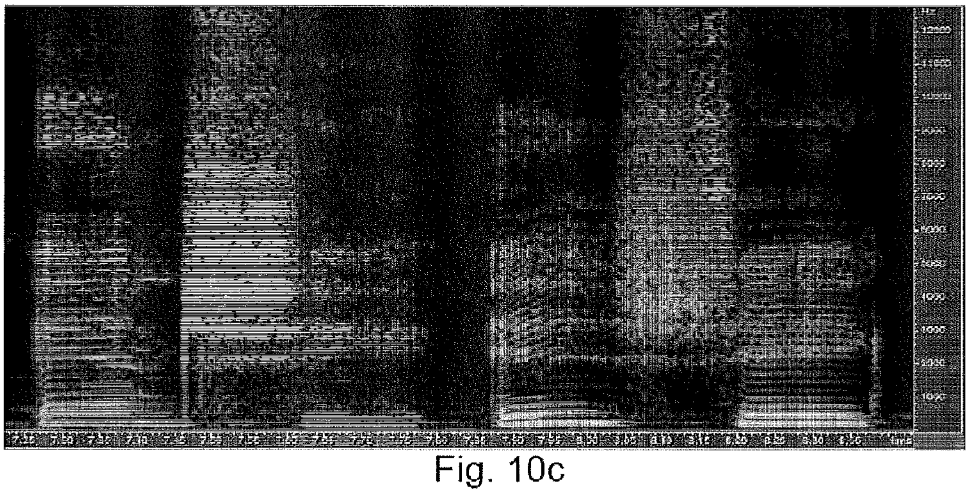
FIG. 10*c* illustrates the spectrogram of the vocal segment of FIG. 10*a* for the original un-coded signal.

In FIG. 10, the output spectra of a real world signal are displayed. In FIG. 10*a*, the output of a MPEG USAC decoder decoding a 12 kbps mono bitstream is depicted. The section of the real world signal is a vocal part of an a cappella recording. The abscissa corresponds to the time axis, whereas the ordinate corresponds to the frequency axis. Comparing the spectrogram of FIG. 10*a* to FIG. 10*c* which displays the corresponding spectrogram of the original signal, it is clear that there are holes (see reference numerals 1001, 1002) appearing in the spectrum for the fricative parts of the vocal segment. In FIG. 10*b* the spectrogram of the output of the MPEG USAC decoder including the present invention is depicted. It can be seen from the spectrogram that the holes in the spectrum have disappeared (see the reference numerals 1003, 1004 corresponding to the reference numerals 1001, 1002.

The complexity of the proposed gain adjustment algorithm was calculated as weighted MOPS, where functions like POW/DIV/TRIG are weighted as 25 operations, and all other operations are weighted as one operation. Given these assumptions, the calculated complexity amounts to approximately 0.1 WMOPS and insignificant RAM/ROM usage. In other words, the proposed gain adjustment processing requires low processing and memory capacity.

In the present document a method and system for generating a highband signal from a lowband signal have been described. The method and system are adapted to generate a highband signal with little or no spectral discontinuities, thereby improving the perceptual performance of high frequency reconstruction methods and systems. The method and system can be easily incorporated into existing audio encoding/decoding systems. In particular, the method and system can be incorporated without the need to modify the envelope adjustment processing of existing audio encoding/decoding systems. Notably this applies to the limiter and interpolation functionality of the envelope adjustment processing which can perform their intended tasks. As such, the described method and system may be used to re-generate highband signals having little or no spectral discontinuities and a low level of noise. Furthermore, the use of control data has been described, wherein the control data may be used to adapt the parameters of the described method and system (and the computational complexity) to the type of audio signal.

The methods and systems described in the present document may be implemented as software, firmware and/or hardware. Certain components may e.g. be implemented as software running on a digital signal processor or microprocessor. Other components may e.g. be implemented as hardware and or as application specific integrated circuits. The signals encountered in the described methods and systems may be stored on media such as random access memory or optical storage media. They may be transferred via networks, such as radio networks, satellite networks, wireless networks or wireline networks, e.g. the internet. Typical devices making use of the methods and systems described in the present document are portable electronic devices or other consumer equipment which are used to store and/or render audio signals. The methods and systems may also be used on computer systems, e.g. internet web servers, which store and provide audio signals, e.g. music signals, for download.

The invention claimed is:

1. A system configured to generate a plurality of high frequency subband signals covering a high frequency interval from a plurality of low frequency subband signals, the system comprising one or more processors adapted to:

receive the plurality of low frequency subband signals;

receive a set of target energies, each target energy covering a different target interval within the high frequency interval and being indicative of the desired energy of one or more high frequency subband signals lying within the target interval;

generate the plurality of high frequency subband signals from the plurality of low frequency subband signals and from a plurality of spectral gain coefficients associated with the plurality of low frequency subband signals, respectively, by applying the plurality of spectral gain coefficients to the plurality of low frequency subband signals; and adjust the energy of the plurality of high frequency subband signals using the set of target energies.

2. The system of claim 1, wherein the one or more processors are further adapted to limit the adjustment of the energy of the high frequency subband signals lying within a limiter interval; and wherein the limiter interval covers more than one target interval.

3. The system of claim 1, wherein the plurality of spectral gain coefficients is associated with the energy of the respective plurality of low frequency subband signals.

4. The system of claim 3, wherein the plurality of spectral gain coefficients is derived from a frequency dependent curve fitted to the energy of the plurality of low frequency subband signals.

5. The system of claim 4, wherein the frequency dependent curve is a polynomial of a pre-determined order.

6. The system of claim 4, wherein a spectral gain coefficient of the plurality of spectral gain coefficients is derived from the difference of the mean energy of the plurality of low frequency subband signals and a corresponding value of the frequency dependent curve.

7. The system of claim 1, wherein the one or more processors are further adapted to amplify the plurality of low frequency subband signals using the respective plurality of spectral gain coefficients.

8. The system of claim 1, wherein the one or more processors are further adapted to perform a copy-up transposition of the plurality of low frequency subband signals; and/or perform a harmonic transposition of the plurality of low frequency subband signals.

9. The system of claim 8, wherein the one or more processors are further adapted to multiply the samples of a low frequency subband signal with the respective spectral gain coefficient of the plurality of spectral gain coefficients, thereby yielding modified samples; and determine a sample of a corresponding high frequency subband signal at a particular time instant from modified samples of the low frequency subband signal at the particular time instant and at least one preceding time instant.

10. The system of claim 9, wherein the sample of the corresponding high frequency subband signal at the particular time instant is determined from the modified samples of the low frequency subband signal using the copy-up algorithm of MPEG-4 SBR.

11. The system of claim 1, wherein the one or more processors are further adapted to ensure that the adjusted-high frequency subband signals lying within a particular target interval have the same energy.

12. The system of claim 1, wherein the plurality of low frequency subband signals and the plurality of high frequency subband signals correspond to subbands of a QMF filterbank; and/or a FFT.

13. The system of claim 1, wherein the one or more processors are further adapted to receive control data indicative of whether to apply the plurality of spectral gain coefficients to generate the plurality of high frequency subband signals; and/or a method for determining the plurality of spectral gain coefficients.

14. The system claim 5, wherein the one or more processors are further adapted to receive control data indicative of the pre-determined order of the polynomial.

15. An audio decoder configured to decode a bitstream representative of a low frequency audio signal and a set of target energies describing the spectral envelope of a corresponding high frequency audio signal, the audio decoder comprising:

a core decoder and transform unit configured to determine a plurality of low frequency subband signals associated with the low frequency audio signal from the bitstream;

a high frequency generation unit according to the system of claim 1, configured to determine a plurality of high frequency subband signals from the plurality of low frequency subband signals and the set of target energies; and a merging and inverse transform unit configured to generate an audio signal from the plurality of low frequency subband signals and the plurality of high frequency subband signals.

16. An encoder configured to generate control data from an audio signal, the audio encoder comprising, one or more processors adapted to:

analyse the spectral shape of the audio signal and to determine a degree of spectral envelope discontinuities introduced when re-generating a high frequency component of the audio signal from a low frequency component of the audio signal, wherein said analysing includes determining on an encoder side by a high frequency reconstruction system related to a decoder side said degree of spectral envelope discontinuities which could be introduced to the high frequency component of the audio signal on the decoder side; and generate control data for controlling the re-generation of the high frequency component based on the degree of discontinuities.

17. A method for generating a plurality of high frequency subband signals covering a high frequency interval from a plurality of low frequency subband signals, the method comprising:

receiving the plurality of low frequency subband signals;

receiving a set of target energies, each target energy covering a different target interval within the high frequency interval and being indicative of the desired energy of one or more high frequency subband signals lying within the target interval;

generating the plurality of high frequency subband signals from the plurality of low frequency subband signals and from a plurality of spectral gain coefficients associated with the plurality of low frequency subband signals, respectively, by applying the plurality of spectral gain coefficients to the plurality of low frequency subband signals; and adjusting the energy of the plurality of high frequency subband signals using the set of target energies.

18. A method for decoding a bitstream representative of a low frequency audio signal and a set of target energies describing the spectral envelope of a corresponding high frequency audio signal, the method comprising:

determining a plurality of low frequency subband signals associated with the low frequency audio signal from the bitstream;

determining a plurality of high frequency subband signals from the plurality of low frequency subband signals and the set of target energies, in accordance to the method outlined in claim 17; and generating an audio signal from the plurality of low frequency subband signals and the plurality of high frequency subband signals.

19. A method for generating control data from an audio signal, the method comprising:

analysing the spectral shape of the audio signal to determine a degree of spectral envelope discontinuities introduced when re-generating a high frequency component of the audio signal from a low frequency component of the audio signal, wherein said analysing includes determining on an encoder side by a high frequency reconstruction system related to a decoder side said degree of spectral envelope discontinuities which could be introduced to the high frequency component of the audio signal on the decoder side; and generating control data for controlling the re-generation of the high frequency component based on the degree of discontinuities.

20. A non-transitory storage medium recording a program of instructions that is executable by a device for performing the method of claim 17.

21. A non-transitory storage medium recording a program of instructions that is executable by a device for performing the method of claim 18.

22. A non-transitory storage medium recording a program of instructions that is executable by a device for performing the method of claim 19.

* * * * *